(12) United States Patent
Evans

(10) Patent No.: US 9,866,175 B1
(45) Date of Patent: Jan. 9, 2018

(54) ROTATED FIELD EFFECT TRANSISTOR TOPOLOGY AMPLIFIER

(71) Applicant: MACOM Technology Solutions Holdings, Inc., Lowell, MA (US)

(72) Inventor: Peter W. Evans, Marrickville (AU)

(73) Assignee: MACOM Technology Solutions Holdings, Inc., Lowell, MA (US)

( * ) Notice: Subject to any disclaimer, the term of this patent is extended or adjusted under 35 U.S.C. 154(b) by 0 days.

(21) Appl. No.: 15/216,814

(22) Filed: Jul. 22, 2016

(51) Int. Cl.
*H03F 1/02* (2006.01)
*H03F 3/193* (2006.01)
*H03F 3/21* (2006.01)
*H03F 3/68* (2006.01)

(52) U.S. Cl.
CPC .......... *H03F 1/0205* (2013.01); *H03F 3/193* (2013.01); *H03F 3/21* (2013.01); *H03F 2200/165* (2013.01); *H03F 2200/21* (2013.01); *H03F 2200/318* (2013.01); *H03F 2200/408* (2013.01); *H03F 2200/451* (2013.01)

(58) Field of Classification Search
USPC .................. 330/124 R, 295, 84, 286, 53–54
See application file for complete search history.

(56) References Cited

U.S. PATENT DOCUMENTS

| | | | | |
|---|---|---|---|---|
| 5,177,381 A | * | 1/1993 | Friesen | G06G 7/24 327/351 |
| 6,359,515 B1 | * | 3/2002 | Buer | H01L 27/0207 257/E29.12 |
| 9,503,035 B2 | * | 11/2016 | Shibuya | H03F 3/195 |

* cited by examiner

*Primary Examiner* — Hieu Nguyen
(74) *Attorney, Agent, or Firm* — Christopher P. Maiorana, PC

(57) ABSTRACT

An apparatus includes multiple field effect transistors and multiple wires. An input wire may be configured to transfer an input signal along an axis. The field effect transistors may be configured to generate a pair of intermediate signals by amplifying the input signal. Multiple gates of the field effect transistors may be configured to receive the input signal. A topology of the gates may be rotated to be perpendicular to the axis. The field effect transistors may be located in two rows mirrored about the axis. Intermediate wires may be configured to transfer the intermediate signals parallel to the axis. A collection wire may be configured to transfer the intermediate signals toward each other and generate an output signal by combining the intermediate signals. An output wire may be configured to transfer the output signal parallel to the axis and away from the field effect transistors.

20 Claims, 7 Drawing Sheets

US 9,866,175 B1

ROTATED FIELD EFFECT TRANSISTOR TOPOLOGY AMPLIFIER

FIELD OF THE INVENTION

The invention relates to millimeter-wave power amplifiers generally and, more particularly, to a method and/or apparatus for implementing a rotated field effect transistor topology amplifier.

BACKGROUND

As customers seek more radio-frequency power amplification at lower dollar cost, conventional amplifiers designed with symmetrical field effect transistor topologies use larger linear banks of mutually heated transistor cells. The large banks lead to large die sizes and overheating channel failure problems. Conventional amplifiers designed with non-symmetrical field effect transistors topologies suffer from gain degradation as a signal frequency increases compared with the conventional symmetrical topologies so the non-symmetrical topologies are commonly limited to low frequencies.

It would be desirable to implement a rotated field effect transistor topology amplifier.

SUMMARY

The invention concerns an apparatus including multiple field effect transistors and multiple wires. An input wire may be configured to transfer an input signal along an axis. The field effect transistors may be configured to generate a pair of intermediate signals by amplifying the input signal. Multiple gates of the field effect transistors may be configured to receive the input signal. A topology of the gates may be rotated to be perpendicular to the axis. The field effect transistors may be located in two rows mirrored about the axis. Intermediate wires may be configured to transfer the intermediate signals parallel to the axis. A collection wire may be configured to transfer the intermediate signals toward each other and generate an output signal by combining the intermediate signals. An output wire may be configured to transfer the output signal parallel to the axis and away from the field effect transistors.

BRIEF DESCRIPTION OF THE FIGURES

Embodiments of the invention will be apparent from the following detailed description and the appended claims and drawings in which:

DETAILED DESCRIPTION OF THE EMBODIMENTS

Embodiments of the present invention include providing a rotated field effect transistor topology amplifier that may (i) provide efficient die utilization, (ii) maintain a cool operating temperature, (iii) provide for compact low-loss inter-stage matching, (iv) provide good power combining, (v) provide efficient amplification, (vi) operate at millimeter-wave frequencies and/or (vii) be implemented as one or more integrated circuits.

Various embodiments of the invention generally provide a rotated field effect transistor topology that orients the individual transistor cells approximately 90 degrees relative to an input wire and introduces signal asymmetry into the cells. The transistor cells in the topology may be packed into a die space more efficiently and maintain sufficient separation for cool operating temperatures, while allowing for compact low-loss inter-stage matching and power combining. The rotated topology generally forms quasi-distributed field effect transistor cells with good broadband performance and good efficiency. Models were developed and a practical high power point-to-point power amplifier designed was achieved with higher radio-frequency power per square millimeter of die than common amplifiers. The rotated topology generally has broad application for millimeter-wave power amplifiers.

Figure 1:
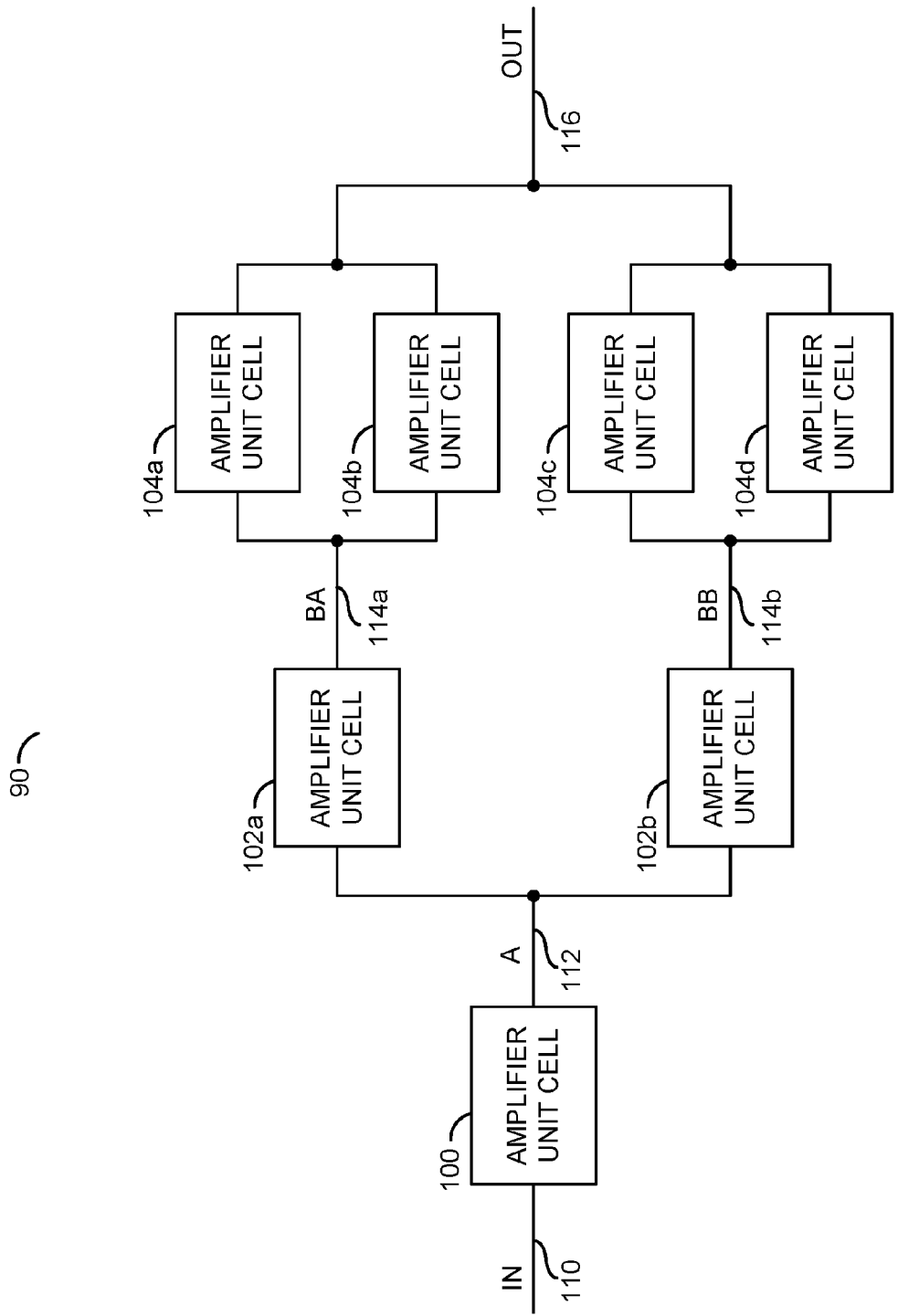
FIG. 1 is a block diagram of an amplifier.

Referring to FIG. 1, a block diagram of a circuit (or system or device) 90 is shown. The circuit 90 may implement a multistage (e.g., three-stage) millimeter-wave power amplifier. The multistage power amplifier 90 generally comprises a block (or circuit) 100 in an initial stage, multiple blocks (or circuits) 102a-102b in an intermediate stage and multiple blocks (or circuits) 104a-104d in a final stage. In various embodiments, the power amplifier 90 may be implemented as a single integrated circuit (e.g., a monolithic microwave integrated circuit (MMIC)). In some designs, the stages of the power amplifier 90 may be in a 1:2:4 unit cell ratio.

An input wire 110 may be connected to an input node of the circuit 100. An intermediate wire 112 may connect an output node of the circuit 100 to input nodes of the circuits 102a-102b. Another intermediate wire 114a may connect output nodes of the circuit 102a to input nodes of the circuit 104a-104b. An intermediate wire 114b may connect output nodes of the circuit 102b to input nodes of the circuit 104c-104d. An output wire 116 may connect output nodes of the circuits 104a-104d to each other.

A signal (e.g., IN) may be received by the circuit 100 on the input wire 110. The signal IN may implement an input signal that carries a radio-frequency signal. In various embodiments, the signal IN may have a frequency of at least five gigahertz (GHz)(e.g., a millimeter-wave signal). The circuit 100 may generate a signal (e.g., A) on the intermediate wire 112. The intermediate signal A may carry an amplified version of the radio-frequency signal IN. The circuit 102a may generate a signal (e.g., BA) on the intermediate wire 114a. The intermediate signal BA may carry an amplified version of the signal A. The circuit 102b may generate a signal (e.g., BB) on the intermediate wire 114b. The intermediate signal BB may carry an amplified version of the signal A. The circuits 104a-104d may generate a signal (e.g., OUT) on the output wire 116. The output signal OUT may convey an amplified version of the signals BA and BB.

The circuit (or apparatus) 100 may implement an amplifier unit cell. The unit cell 100 is generally operational to amplify the information received in the signal IN to generate the signal A. The unit cell 100 may reside in the initial stage of the power amplifier 90. A gain of the unit cell 100 may be several decibels (e.g., approximately 1 decibels (dB) to approximately 20 dB) over a wide frequency range (e.g., approximately 1 GHz to at least 50 GHz). In various embodiments, the unit cell 100 may operate in a range of frequencies from super high frequencies to extremely high (or millimeter-wave) frequencies (e.g., 3 GHz to 300 GHz). In other embodiments, the circuit 100 may operate at microwave frequencies. Other frequency bands of operation may be implemented to meet the design criteria of a particular application.

Each circuit 102a-102b may implement an amplifier unit cell. Input nodes of the unit cells 102a-102b may be connected to each other to operate in parallel. The unit cells 102a-102b may reside in the intermediate stage of the power amplifier 90. The unit cells 102a-102b may be configured to amplify the information received in the signal A to generate the signals BA and BB. In various embodiments, each unit cell 102a-102b may be a copy (or an instantiation) of the unit cell 100. Other numbers of unit cells 102a-102b may be implemented to meet the design criteria of a particular application.

Each circuit 104a-104d may implement an amplifier unit cell. Output nodes of the unit cells 104a-104d may be connected to each other to operate in parallel. The unit cells 104a-104d may be configured to amplify the information received in the signals BA and BB to generate the signal OUT. The unit cells 104a-104d may reside in the final stage of the power amplifier 90. In various embodiments, each unit cell 104a-104d may be a copy (or an instantiation) of the unit cell 100. Other numbers of unit cells 104a-104d may be implemented to meet the design criteria of a particular application.

Figure 2:
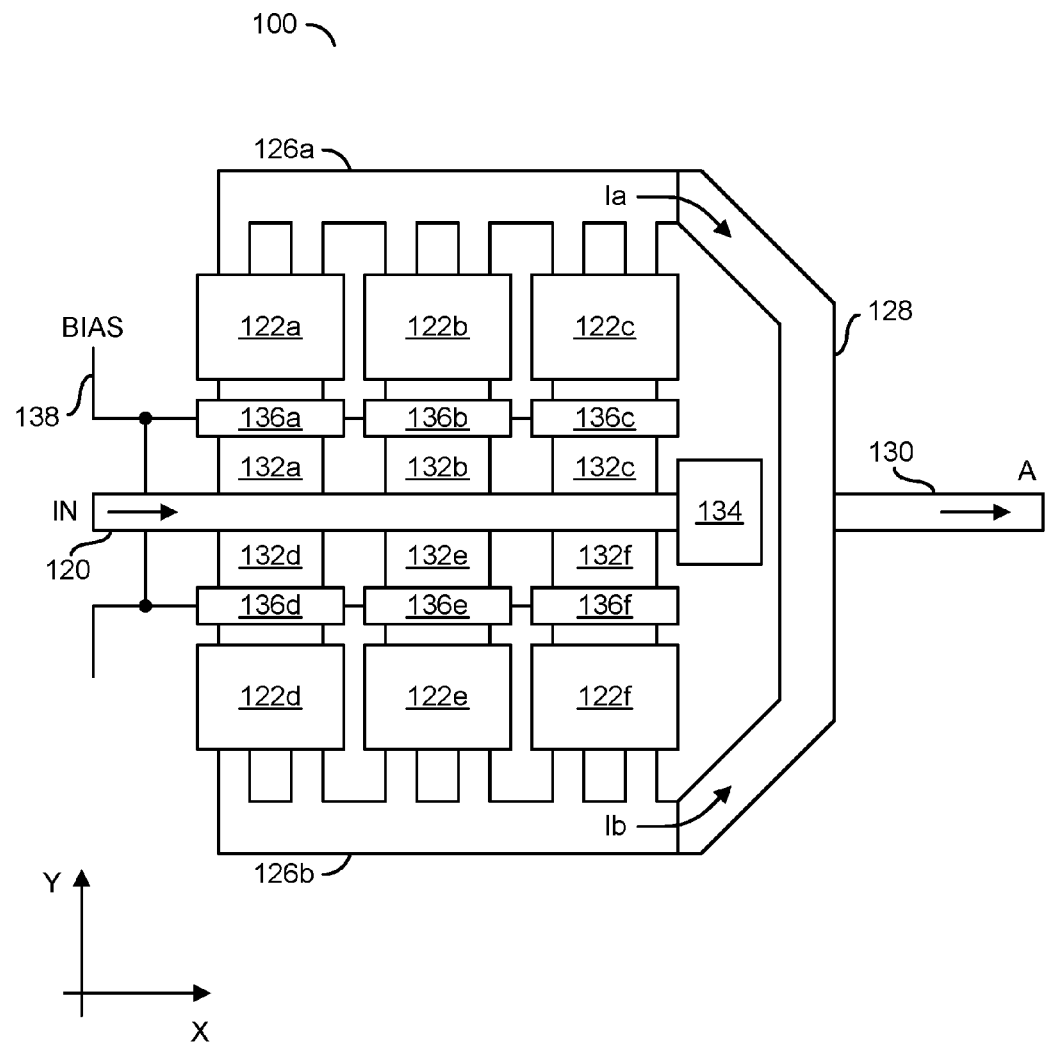
FIG. 2 is a diagram of a unit cell in the amplifier in accordance with an embodiment of the invention.

Referring to FIG. 2, a diagram of an example layout of the unit cell 100 is shown in accordance with an embodiment of the invention. The layout (or topology) of the unit cell 100 may represent each unit cell 100, 102a-102b and 104a-104d. The unit cell 100 generally comprises an input wire (or trace) 120, at least two transistors (or devices) 122a-122f, a pair of intermediate wires (or traces) 126a-126b, an intermediate wire (or trace) 128, an output wire (or trace) 130, multiple capacitors 132a-132f, a ground connection (or node) 134, multiple resistors 136a-136f and a bias wire (or trace) 138.

The input wire 120 may be configured to carry the signal IN for the unit cell 100 (the signal A for the unit cells 102a-102b, and the signals BA and BB for the unit cells 104a-104d). The input wire 120 may be oriented parallel to an x-axis in an x-y coordinate system. As illustrated, the signal IN may propagate in a +x direction (e.g., left to right) along the input wire 120. The input wire 120 may define an input axis of the unit cell 100.

Each transistor 122a-122f may implement a field effect transistor. The field effect transistors (FETs) 122a-122f may include, but are not limited to metal oxide semiconductor (MOS) FETs, junction FETs, pseudomorphic high electron mobility transistors (pHEMT), metal-semiconductor field effect transistors (MESFET), p-channel FETs, n-channel FETs, depletion node FETS, enhancement mode FETs, silicon (Si) FETs gallium nitrate (GaN) FETs, gallium arsenide (GaAs) FETs and/or silicon germanium (SiGe) FETs. Other transistor technologies and/or materials may be implemented to meet the design criteria of a particular application.

The transistors 122a-122f may be arranged in two rows mirrored about the x-axis, one row on each side of the input wire 120. One or more (e.g., 1, 2, 3, etc.) transistors 122a-122f may be located in each row. As illustrated, half of the transistors (e.g., 122a-122c) may be located in an upper transistor row and the other half of the transistors (e.g., 122d-122f) may be located in a lower transistor row. Within each transistor row, the transistors 122a-122c and 122d-122f may be adjacent each other and aligned to the x-axis. Each transistor 122a-122f may have one or more gate fingers that establish one or more source-to-drain channels.

The transistors 122a-122f may be rotated in the x-y axis coordinate system so that gate fingers of the transistors 122a-122f run parallel to the y-axis of the coordinate system. The rotation generally reduces a transversal dimension of an area that the unit cells 100-104d occupy on the die while spreading the heat generated in the gate fingers more evenly over the die compared with traditional linear lines of transistors. As such, the power amplifier 90 may be made smaller, at a lower cost, and with a lower failure rate in the field compared with typical designs because the transistors 122a-122f do not get as hot.

The intermediate wires 126a-126b may be connected to drain nodes of the transistors 122a-122f. The intermediate wires 126a-126b may be mirrored about the x-axis, one on each side of the input wire 120. The intermediate wire 126a may carry a signal (e.g., Ia) generated by the transistors 122a-122c. The intermediate wire 126b may carry a signal (e.g., Ib) generated by the transistors 122ad-122f. Each intermediate signal Ia and Ib may be an amplified version of the signal IN. The signals Ia and Ib generally flow in the +x direction within the intermediate wires 126a-126b parallel to the x-axis.

The intermediate wire 128 may implement a collection wire. The collection wire 128 is generally oriented parallel to the y-axis. Each end of the collection wire 128 may be connected to an end of a respective intermediate wire 126a-126b. The signals Ia and Ib may flow from the intermediate wires 126a-126b into the collection wire 128. The signal flows in the collection wire 128 may be in opposite directions. The signal Ia and the signal Ib generally flow toward each other and are combined at or near a center of the collection wire 128.

The output wire 130 may be oriented parallel to the x-axis. The output wire 130 may be connected to the collection wire 128 at or near the center of the collection wire 128. The signal A may be a combination of the signals Ia and Ib. The signal A generally flows in the +x direction in the output wire 130, parallel to the x-axis, and away from the transistors 122a-122f. The output wire 130 generally defines an output axis of the unit cell 100.

Each capacitor 132a-132f may be connected between the input wire 120 and a respective transistor 122a-122f. As illustrated, half of the capacitors (e.g., 132a-132c) may be located in an upper capacitor row and the other half of the capacitors (e.g., 132d-132f) may be located in a lower capacitor row. Within each capacitor row, the capacitors 132a-132c and 132d-132f may be adjacent each other and aligned to the x-axis. Mirrored pairs of capacitors (e.g., 132a and 132d, 132b and 132e, 132c and 132f) may be connected to the input wire 120 at different locations along the x-axis.

The node 134 may implement a ground connection. The ground connection 134 generally forms a part of a matching circuit to the transistors 122a-122f preventing the signal IN from reflecting back in the −x direction (e.g., from right to left) in the input wire 120.

Each resistor 136a-136f may be connected between a source of a bias voltage (e.g., a source of the gate bias voltage conveyed in the signal BIAS) and a respective transistor 122a-122f. As illustrated, half of the resistors (e.g., 136a-136c) may be located in an upper resistor row and the other half of the resistors (e.g., 136d-136f) may be located in a lower resistor row. Within each resistor row, the resistors 136a-136c may be connected in series with each other and the resistors 136d-136f may be connected in series with each other.

Rotating the transistors 122a-122f in a MMIC power amplifier design may reduce the die size and therefore cost. The asymmetric structure, created by the distributed connections along the wires 120 and 126a-126b to get signals into and out of the transistors 122a-122f, may be configured to maintain amplification performance. The performance may be maintained using a distributed capacitive network created by the capacitors 132a-132c on the input side of the transistors 122a-122f. The DC bias in the signal BIAS may be decoupled from the radio-frequency content in the signal IN, making biasing simple using the resistors 136a-136f.

A matching network formed by the capacitors 132a-132f, inductances of the input wire 120 and the ground connection 134, and input resistances of the transistor 122a-122f may have a bandpass filter characteristic. The bandpass filtering generally reduces a probability of low frequency oscillation in the individual unit cells 100-104d and/or power amplifier 90. The matching network generally compensates for the asymmetry in the structure of the unit cell 100. Adjusting the capacitances of the capacitors 132a-132f and/or a length of the input wire 120 may allow adjustments to the performance for particular frequency bands. The die size for a given number of transistors 122a-122f may thus be reduced, lowering the cost of the unit cells 100-104d, and without degrading the thermal performance.

Figure 3:
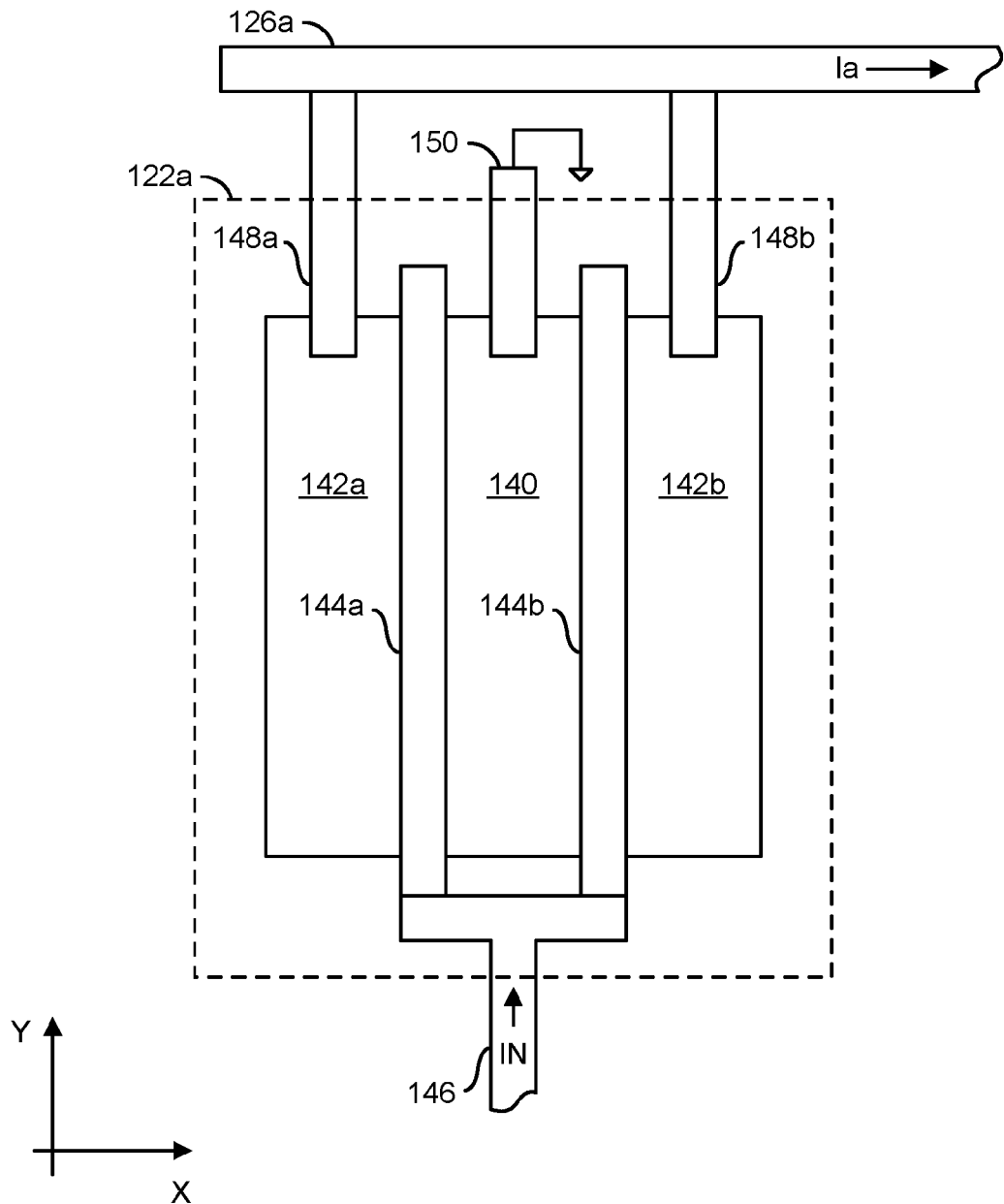
FIG. 3 is a diagram of a layout of a transistor within the unit cell.

Referring to FIG. 3, a diagram of an example layout of the transistor 122a (or sub-unit of the unit cell 100) is shown. The layout (or topology) of the transistor 122a may represent each transistor 122a-122f. The transistor 122a generally comprises a source 140, multiple drains 142a-142b, multiple gate fingers 144a-144b, a gate wire 146, multiple drain wires 148a-148b and a source wire 150.

The signal IN may be received by the transistor 122a on the gate wire 146 from the capacitor 132a. The gate wire 146 may be configured to distribute the signal IN to each of the gate fingers 144a-144b. The gate fingers 144a-144b and the FET channels below the gate fingers 144a-144b may be oriented perpendicular to the input wire 120 (e.g., perpendicular to the x-axis). Other numbers of gate fingers 144a-144b may be implemented to meet the design criteria of a particular application.

The gates 144a-144b, source 140 and drains 142a-142b of the transistor 122a generally amplify the signal IN to generate a portion of the intermediate current Ia in the drain wires 148a-148b and the source wire 150. The source wire 150 is generally connected to a signal ground. Each drain wire 148a-148b may be connected to the intermediate wire 126a at different locations. The topology of the transistor 122a may be repeated in the transistors 122b-122c. The topology of the transistor 122a may be mirrored about the x-axis for the transistors 122d-122f. The drains of the transistors 122d-122f may be connected to the intermediate wire 126b and generate the intermediate signal Ib.

Figure 4:
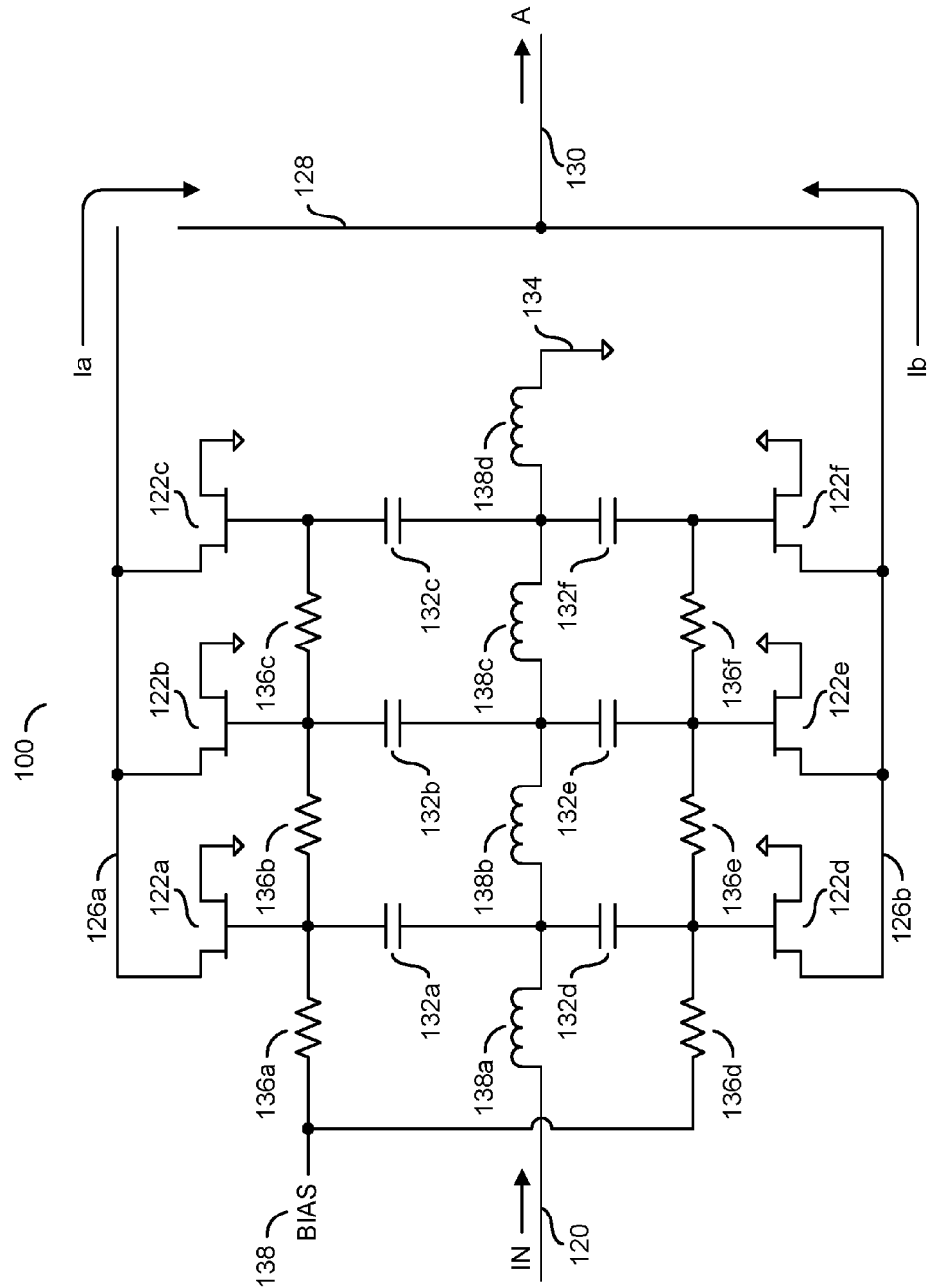
FIG. 4 is a schematic of the unit cell.

Referring to FIG. 4, a schematic of the example implementation of the unit cell 100 in FIG. 2 is shown. The input wire 120 and the ground connection 134 may act as small inductances, represented in the schematic by series inductors 138a-138d. The inductors 138a-138d, the capacitors 132a-132f and the input resistances of the transistors 122a-122f may form the matching network into the transistors 122a-122f. The matching network generally resonates to set a frequency band over which the unit cell 100 is optimized.

The input wire 120 may asymmetrically distribute the signal IN to each transistor 122a-122f due to propagation delays. For example, the signal IN may initially reach the transistor pair 122a and 122d and the transistor pair 122c and 122f last. The top transistor row may generate the intermediate signal Ia in the intermediate wire 126a. The bottom transistor row may generate the intermediate signal Ib in the intermediate wire 126b. The collection wire 128 may combine the signals Ia and Ib to create the output signal A. The output wire 130 may transfer the output signal A to the next set of unit cells 102a-102b.

Figure 5:
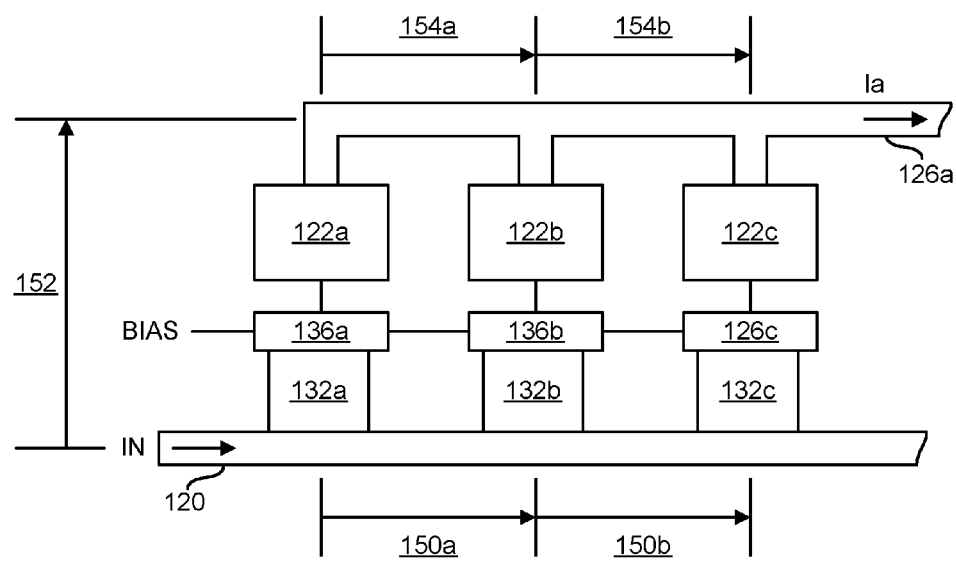
FIG. 5 is a diagram illustrating propagation delays through the unit cell.

Referring to FIG. 5, a diagram illustrating propagation delays through the unit cell 100 is shown. The input signal IN may propagate along the input wire 120 in the +x direction. A delay 150a may exist between a time when the signal IN reaches the capacitor 132a and when the signal IN reaches the capacitor 132b. A delay 150b may exist between a time when the signal IN reaches the capacitor 132b and when the signal IN reaches the capacitor 132c. The topology of the unit cell 100 may be arranged such that the delay 150a matches the delay 150b. Where additional transistors are implemented in both the top transistor row and the bottom transistor row, the topology may be designed to match the subsequent delays to the delays 150a and 150b between adjacent pairs of capacitors.

Along the +y direction, a propagation delay 152 may exist from a time when the signal IN reaches the capacitor 132a and the transistor 122a drives a portion of the signal Ia on the intermediate wire 126a. The portion of the signal Ia created by the transistor 122a may propagate in the +x direction along the intermediate wire 126a for a delay 154a until reaching the transistors 122b. The capacitor 132b/transistor 122b may have a similar signal propagation delay 152 from the signal IN in the input wire 120 to the signal Ia in the intermediate wire 126a. The portion of the signal Ia created by the transistor 122b may propagate in the +x direction along the intermediate wire 126a for a delay 154b until reaching the transistor 122c. The capacitor 132c/transistor 122c may have a similar signal propagation delay 152 from the signal IN in the input wire 120 to the signal Ia in the intermediate wire 126a.

A layout of the unit cell 100 may be designed such that the propagation delay 154a matches the propagation delay 154b, the propagation delay 150a and the propagation delay 150b. The asymmetrical delay along the input wire 120 may be canceled by a similar asymmetrical delay along the intermediate wire 126a. A similar asymmetrical delay along the intermediate wire 126b may be used to create the signal Ib.

Figure 6:
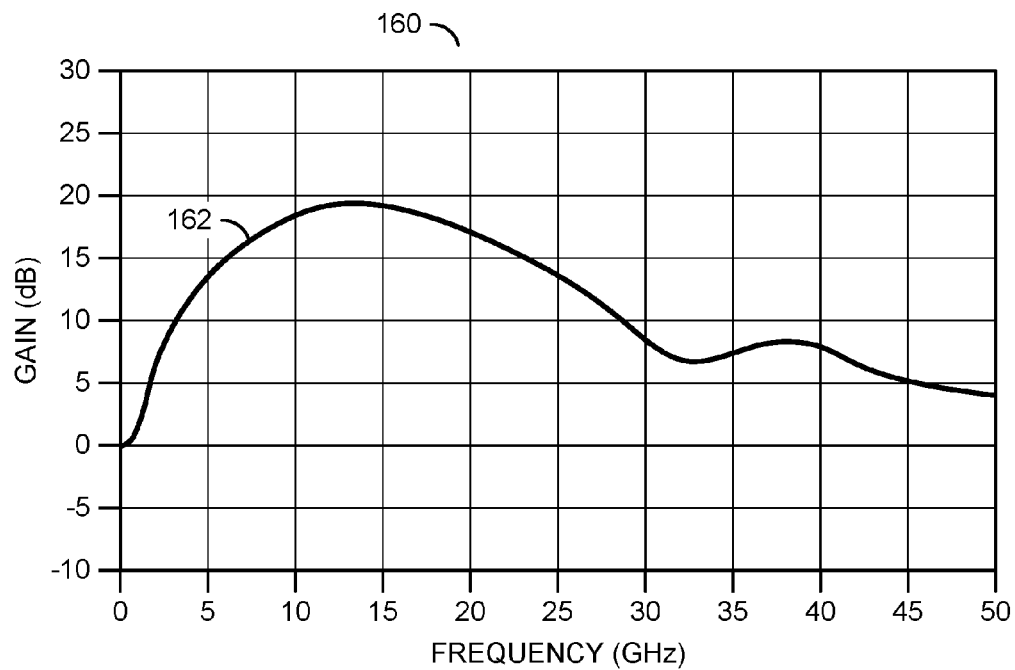
FIG. 6 is a graph of a simulated unilateral gain of the unit cell.

Referring to FIG. 6, a graph 160 of a simulated unilateral gain 162 of a prototype implementation of the unit cell 100 is shown. For efficient use of die area, the transistors 122a-122f were rotated and packed into the two transistor rows. The simulated prototype amplifier was developed for a high frequency (e.g., 23 GHz) power amplifier. A peak gain of approximately 20 dB was simulated at around 15 GHz. The gain generally falls to about 5 dB at 3 GHz. The prototype amplifier utilized approximately 8 millimeters (mm) of FET periphery in an output stage. The output stage of the prototype amplifier generally has four unit cells, each with 2.04 mm of periphery (4×2.04 mm=8.16 mm periphery). Each unit cell may have six rotated transistors. Each transistor generally has four fingers that are each 85 micrometers (μm) wide (6×4×85 μm=2.04 mm periphery).

Figure 7:
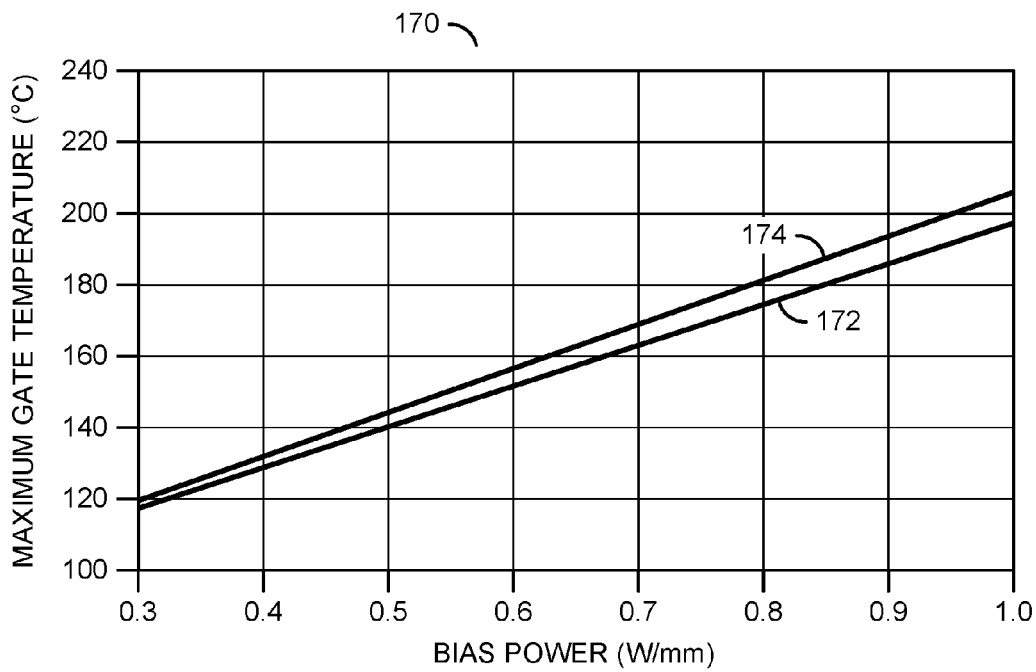
FIG. 7 is a graph of simulated peak channel temperatures of the unit cell.

Referring to FIG. 7, a graph 170 of simulated peak channel temperatures of the unit cell 100 is shown. A line 172 generally illustrates the maximum gate temperature of the unit cell 100 as a function of bias power at an 85 degree Celsius package backside temperature. A line 174 generally illustrates the maximum gain temperature of a typical unit cell as a function of the bias power at the 85 degree Celsius package backside temperature. The transistor channel peak temperature was derived from thermal simulations of transistor cell arrays using a SYMMIC thermal simulator from CapeSym, Inc., Natick, Mass. The unit cell 100 and the typical unit cell had the same periphery dimension of the gate fingers. The typical unit cell is approximately 1.5 times wider (consumes more area) than the unit cell 100.

By way of example, using a design goal that constrains the peak channel temperature to 160 degrees Celsius, the unit cell 100 may be constrained to a bias power of around 0.7 watts/mm. In contrast, the typical amplifier design is constrained to a bias power of around 0.62 watts/mm. At the bias power of 0.62 watts/mm, the unit cell 100 generally runs about 8 degrees Celsius cooler than the typical amplifier. The cooler operating temperature results in a longer life of the unit cell 100 compared with the typical amplifier.

Figure 8:
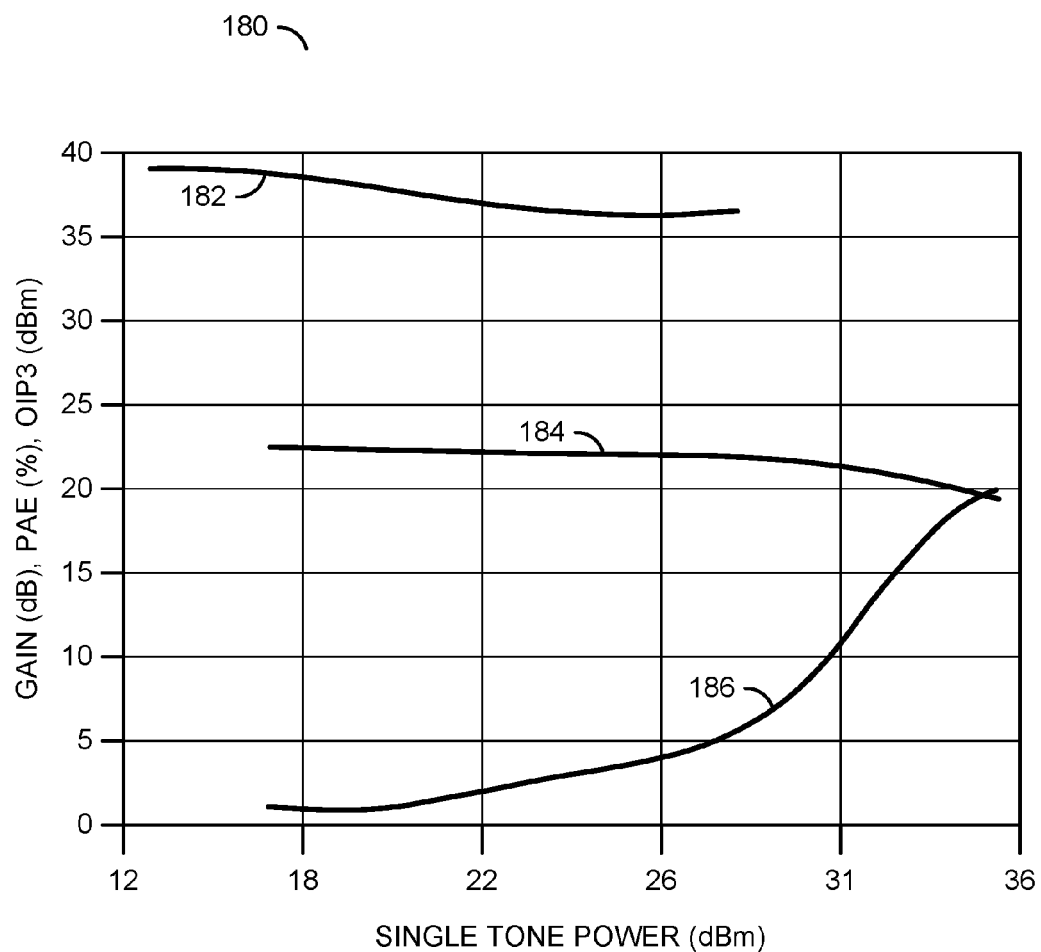
FIG. 8 is a graph of a performance summary of the amplifier.

Referring to FIG. 8, a graph 190 of a performance summary of the power amplifier 90 is shown. The performance summary was measured over a range of approximately 17 GHz to 35 GHz with a quiescent bias of 0.55 watts/mm. A curve 182 generally illustrates a third-order output intercept point (OIP3) performance of the power amplifier 90 expressed in decibel milliwatts (dBm). The OIP3 performance is a measure of linearity in the amplification. A curve 184 may illustrate a gain of the power amplifier 90 expressed in decibels (dB). A curve 186 may illustrate a power-added efficiency (PAE) of the power amplifier 90 expressed in percentage. The power-added efficiency is a ratio of added radio-frequency power over the DC power received by the power amplifier 90.

Designs of power amplifier die generally consider thermal limitations. Achieving radio-frequency output power and/or linearity and efficiency may utilize a large number of active transistors, with enough stages scaled sufficiently and matched accordingly to deliver a specified performance. Five factors generally determine the channel temperature that occurs during normal operation: an ambient temperature substrate, a gate width, a gate-to-gate spacing, a thickness and material of a substrate, and a bias condition of the transistors. The ambient temperature may be specified as the die or package backside temperature. A typical chip specification may limit a maximum backside temperature of +85 degrees Celsius, with a mean time to failure of greater $10^6$ hours at that temperature. In terms of the gate width, wider gates generally have worse performance as electrical resistance and mutual heating effects increase. Heating is fairly localized around the channel, so spacing adjacent gates further apart may reduce mutual heating, and may also reduce a relative penalty of using wider gates. The substrate that the transistors is built in (on) generally dominates the thermal resistance to any heat spreader attached to the backside of the die. The bias condition that the transistors operate is typically expressed in terms of watts per millimeter of the transistor gate, and accounts for how much current at a particular voltage traverses a given section of transistor channel.

A cost of the die may be proportional to an X×Y area, so a reduction in one or both dimensions may reduce the cost of the chip. In various embodiments, the invention may rotate transistor cells approximately 90 degrees and stack up the rotated cells. By rotating the transistors 122a-122f so that the gate fingers 144a-144b run perpendicular to the input axis (e.g., the input wire 120) and/or the output axis (e.g., the output wire 130), the transversal dimension of the die may be reduced while spreading the heat generated in the gate fingers more evenly over the die. Therefore, the power amplifier 90 may be made more cheaply due to the smaller die and with lower failure rates in the field. In various embodiments, the stages of the power amplifier 90 may be in a 1:2:4 cell ratio for a total of 14.28 mm of periphery in 168 gates.

The functions and structures illustrated in the diagrams of FIGS. 1 to 4 may be designed, modeled, emulated, and/or simulated using one or more of a conventional general purpose processor, digital computer, microprocessor, microcontroller, distributed computer resources and/or similar computational machines, programmed according to the teachings of the present specification, as will be apparent to those skilled in the relevant art(s). Appropriate software, firmware, coding, routines, instructions, opcodes, microcode, and/or program modules may readily be prepared by skilled programmers based on the teachings of the present disclosure, as will also be apparent to those skilled in the relevant art(s). The software is generally embodied in a medium or several media, for example non-transitory storage media, and may be executed by one or more of the processors sequentially or in parallel.

Embodiments of the present invention may also be implemented in one or more of ASICs (application specific integrated circuits), FPGAs (field programmable gate arrays), PLDs (programmable logic devices), CPLDs (complex programmable logic device), sea-of-gates, ASSPs (application specific standard products), and integrated circuits. The circuitry may be implemented based on one or more hardware description languages. Embodiments of the present invention may be utilized in connection with flash memory, nonvolatile memory, random access memory, read-only memory, magnetic disks, floppy disks, optical disks such as DVDs and DVD RAM, magneto-optical disks and/or distributed storage systems.

The terms "may" and "generally" when used herein in conjunction with "is(are)" and verbs are meant to communicate the intention that the description is exemplary and believed to be broad enough to encompass both the specific examples presented in the disclosure as well as alternative examples that could be derived based on the disclosure. The terms "may" and "generally" as used herein should not be construed to necessarily imply the desirability or possibility of omitting a corresponding element.

While the invention has been particularly shown and described with reference to embodiments thereof, it will be understood by those skilled in the art that various changes in form and details may be made without departing from the scope of the invention.

The invention claimed is:

1. An apparatus comprising:
   a first stage having a unit cell comprising (A) an input wire at a first side of said unit cell and configured to transfer an input signal along an axis, wherein said input signal comprises a millimeter-wave signal; (B) a plurality of field effect transistors configured to generate a pair of intermediate signals by amplifying said input signal, wherein (i) a plurality of gates of said field effect transistors are configured to receive said input signal, (ii) a topology of said gates are rotated to be perpendicular to said axis and (iii) said field effect transistors are located in two rows mirrored about said axis; (C) a pair of intermediate wires configured to transfer said intermediate signals in a single direction parallel to said axis toward a second side of said unit cell opposite said first side; (D) a collection wire configured to transfer said intermediate signals toward each other and generate an output signal by combining said intermediate signals; and (E) an output wire at said second side of said unit cell and configured to transfer said output signal parallel to said axis and away from said field effect transistors;
a second stage comprising a plurality of said unit cells arranged in parallel, wherein all of said input wires of said unit cells in said second stage are coupled to said output wire of said unit cell in said first stage; and
a third stage comprising a plurality of said unit cells arranged in parallel, wherein each of said input wires of said unit cells in said third stage are coupled at most to a single of said output wires of said unit cells in said second stage.

2. The apparatus according to claim 1, wherein said unit cell further comprises a plurality of capacitors configured to couple said input signal from said input wire to said gates of said field effect transistors.

3. The apparatus according to claim 2, wherein said unit cell further comprises a plurality of resistors coupled to said gates and said capacitors and configured to carry a bias voltage to said gates.

4. The apparatus according to claim 2, wherein said capacitors form part of a bandpass filter that filters said input signal.

5. The apparatus according to claim 1, wherein said unit cell further comprises an inductor configured to connect one end of said input wire to ground.

6. The apparatus according to claim 1, wherein said field effect transistors in said unit cell comprise at least four field effect transistors evenly divided between said two rows.

7. The apparatus according to claim 6, wherein said unit cell further comprises (i) a first pair of resistors directly connected between a node and each of said gates of a first pair of said field effect transistors and (ii) a second pair of resistors directly connected between said gates of said first pair of said field effect transistors and a second pair of said field effect transistors.

8. The apparatus according to claim 6, wherein said field effect transistors in said unit cell are spatially arranged such that a propagation delay of said input signal along said input wire between adjacent pairs of said field effect transistors approximately matches that of said intermediate signals along said intermediate wires between said adjacent pairs of said field effect transistors.

9. The apparatus according to claim 1, wherein a frequency of said input signal is at least five gigahertz.

10. The apparatus according to claim 1, wherein said unit cells form part of a multistage power amplifier.

11. A method for amplification using a rotated topology, comprising the steps of:
transferring an input signal in an input wire at a first side of a unit cell in a first stage along an axis toward a plurality of field effect transistors of said unit cell, wherein said input signal comprises a millimeter-wave signal;
generating in said unit cell a pair of intermediate signals in a pair of intermediate wires by amplifying said input signal using said field effect transistors, wherein (i) a plurality of gates of said field effect transistors are configured to receive said input signal, (ii) a topology of said gates are rotated to be perpendicular to said axis and (iii) said field effect transistors are located in two rows mirrored about said axis;
transferring said intermediate signals in a single direction parallel to said axis toward a second side of said unit cell opposite said first side;
transferring said intermediate signals toward each other;
generating an output signal of said unit cell by combining said intermediate signals;
transferring said output signal parallel to said axis and away from said field effect transistors along an output wire at said second side of said unit cell;
amplifying said output signal of said first stage in a plurality of said unit cells arranged in parallel in a second stage, wherein all of said input wires of said unit cells in said second stage are coupled to said output wire of said unit cell in said first stage; and
amplifying said output signals of said second stage in a plurality of said unit cells arranged in parallel in a third stage, wherein each of said input wires of said unit cells in said third stage are coupled at most to a single of said output wires of said unit cells in said second stage.

12. The method according to claim 11, further comprising the step of:
coupling said input signal from said input wire in said unit cell to said gates of said field effect transistors in said unit cell through a plurality of capacitors.

13. The method according to claim 12, further comprising the step of:
carrying a bias voltage to said gates in said unit cell through a plurality of resistors coupled to said gates and said capacitors.

14. The method according to claim 12, further comprising the step of:
filtering said input signal in said unit cell with a bandpass filter formed by said capacitors.

15. The method according to claim 11, further comprising the step of:
grounding said input signal at one end of said input wire in said unit cell through an inductor.

16. The method according to claim 11, wherein said field effect transistors of said unit cell comprises at least four field effect transistors evenly divided between said two rows.

17. The method according to claim 16, wherein (i) a first pair of resistors directly connected between a node and each of said gates of a first pair of said field effect transistors in said unit cell and (ii) a second pair of resistors directly connected between said gates of said first pair of said field effect transistors and a second pair of said field effect transistors in said unit cell.

18. The method according to claim 16, wherein said field effect transistors in said unit cell are spatially arranged such that a propagation delay of said input signal along said input wire between adjacent pairs of said field effect transistors approximately matches that of said intermediate signals along said intermediate wires between said adjacent pairs of said field effect transistors.

19. The method according to claim 11, wherein a frequency of said input signal is at least five gigahertz.

20. The method according to claim 11, wherein said steps are implemented in a multistage power amplifier.

* * * * *